United States Patent [19]
Dhong et al.

[11] Patent Number: 5,157,634
[45] Date of Patent: Oct. 20, 1992

[54] DRAM HAVING EXTENDED REFRESH TIME

[75] Inventors: Sang H. Dhong, Mahopac; Robert L. Franch, Wappinger Falls; Wei Hwang, Armonk, all of N.Y.

[73] Assignee: International Business Machines Corporation, Armonk, N.Y.

[21] Appl. No.: 602,037

[22] Filed: Oct. 23, 1990

[51] Int. Cl.⁵ .............................................. G11C 13/00
[52] U.S. Cl. ............................... 365/222; 365/189.01
[58] Field of Search ............... 365/222, 189.01, 230.01

[56] References Cited

U.S. PATENT DOCUMENTS

| | | | |
|---|---|---|---|
| 4,449,205 | 5/1984 | Hoffman | 365/182 |
| 4,610,003 | 9/1986 | Natori | 365/228 |
| 4,630,241 | 12/1986 | Kobayashi et al. | 365/200 |
| 4,672,581 | 8/1987 | Waller | 365/200 |
| 4,688,219 | 8/1987 | Takemae | 371/10 |
| 4,691,301 | 9/1987 | Anderson | 365/200 |
| 4,737,935 | 4/1988 | Wawersig et al. | 365/200 |
| 4,745,582 | 5/1988 | Fukushi et al. | 365/200 |
| 4,748,597 | 5/1988 | Saito et al. | 365/230 |
| 4,750,158 | 6/1988 | Giebel et al. | 365/200 |
| 4,752,914 | 6/1988 | Nakano et al. | 365/200 |
| 4,757,474 | 7/1988 | Fukushi et al. | 365/189 |
| 4,783,781 | 11/1988 | Awaya | 371/10 |
| 4,961,300 | 9/1987 | Pelley, III et al. | 365/200 |

FOREIGN PATENT DOCUMENTS 61-214297 9/1986 Japan .

OTHER PUBLICATIONS

Kindseth, "Dynamic Storage Cleanup", IBM Technical Disclosure Bulletin, vol. 25, No. 4, Sep. 1982, pp. 2032-2035.
Guttmann et al., "Refresh Test of Dynamic Ram", IBM Technical Disclosure Bulletin, vol. 28, No. 5, Oct. 1985, pp. 2172-2173.

Primary Examiner—Terrell W. Fears
Attorney, Agent, or Firm—Perman & Green

[57] ABSTRACT

A DRAM is described including a plurality of operable storage cells, each cell including a capacitance for storing a charge indicative of data. The charge tends to dissipate below an acceptable level after a predetermined time interval T1 for a majority of the operable cells and for a minority of the operable cells, it dissipates below the acceptable level after a shorter time interval T2. The time between DRAM refresh cycles is adjusted so as to be greater than time interval T2. The DRAM comprises: a plurality of redundant storage cells; a decoder for receiving the address of an operable memory cell and providing a first output if the address indicates one of the operable cells of the minority of cells and a second output if the address indicates one of the operable cells of the majority. A switching circuit is responsive to the first output to enable access of a redundant stoarge cell and to prevent access of the minority storage cell. In a preferred embodiment, the redundant storage cells are configured as static storage circuits.

7 Claims, 3 Drawing Sheets

DRAM HAVING EXTENDED REFRESH TIME

FIELD OF THE INVENTION

This invention relates to Dynamic Random Access Memories (DRAM's) and, more particularly, to DRAM's having redundant memory cells.

BACKGROUND OF THE INVENTION

It has been proposed that solid state Random Access Memories (RAM's) be used as replacements for direct access storage devices (e.g. disk drives). To assure non-volatility for such memories, it has further been proposed that low powered DRAMs, with battery backup be employed. The battery backup provides the required non-volatility of the stored data in the event of a power failure.

As is known, DRAMs require a periodic refresh to maintain the data states stored in the cells. Presently, such refresh cycles are programmed to occur at intervals of much less than a second. While such a short interval between refresh cycles readily maintains the stored data in a DRAM, it places a substantial duty cycle on a backup battery and reduces the down-time capability of the memory. The governing factor which determines the interval between refresh cycles is the time it takes for the "most leaky", but operable cell to dissipate its stored charge to a level that can cause data loss. In the prior art, a variety of solutions have been proposed for coping with either the loss of data in DRAM cells arising from a loss of charge, or to the inoperability of such cells. In U.S. Pat. No. 4,610,003 to Natori, a DRAM cell is shown wherein charge leakage control is implemented by changing the turn-off voltage applied to the gate of a cell's transistor. The voltage change increases the insulation between the transistor's source and drain electrodes and prevents discharge of the storage capacitor. In U.S. Pat. No. 4,449,205 to Hoffman, a DRAM cell is shown which includes a non-volatile backup store. In Japanese Patent 61-214297 to Sawata, a leak monitor circuit is employed with a DRAM cell and is used to set an optimum refresh operating allowance so as to assure continued viable data storage in the cell.

In order to determine the viability of individual cells within a DRAM, the prior art has disclosed various techniques for testing such cells. Two of such techniques are disclosed by Gutmann et al., IBM Technical Disclosure Bulletin, Vol. 28, No. 5, October 1985 pages 2172–2173 and by Kindseth, IBM Technical Disclosure Bulletin Vol. 25, No. 4, September 1982 pages 2032–2035. Gutmann et al. indicate that the refresh capability of a DRAM is conventionally tested by first writing data to the memory and then waiting for a period of time before reading it back to see if it is accurately reproduced. In this instance, Gutmann et al suggest that the row address strobe signal be used to eliminate the need for a long waiting period during the test. Kindseth on the other hand, suggests modifying the ongoing refresh cycle of a DRAM to apply the stored data to error correcting circuitry. In other words, the error correction and store operations both occur during the refresh cycle.

In lieu of giving up valuable chip real estate for charge enhancing circuity for every cell or for continuous testing of such cell arrays, the prior art teaches the use of redundant storage cells to replace defective DRAM cells. Characteristically, such DRAMS include a programmable read only memory (PROM) which contains the addresses of the defective memory cells. The contents of the PROM are inserted at the time the DRAM is subjected to "final test" in the manufacturing operation and identifies those cells which are defective and are to be replaced by the redundant cells.

When an address is received for one of the defective memory cells, the address is compared with one of the addresses stored in the PROM and if a match is found, the decoder feeding the regular memory cell array is inhibited and a decoder feeding the redundant array is enabled. Such operation is shown in U.S. Pat. No. 4,757,474 to Fukushi et al., however, they employ a multilevel selection circuit for determining which memory addresses are to go to the redundant cells decoder. The selection circuit examines the most significant and least significant address bits to make the determination. DRAM's employing redundant cells also can be found in U.S. Pat. Nos. 4,745,582 to Fukushi et al., 4,752,914 to Nakano et al., 4,783,781 to Awaya, 4,750,158 to Giebel et al., 4,748,597 to Saito et al., 4,691,301 to Anderson, 4,688,219 to Takemae, 4,630,241 to Kobayashi et al., 4,672,581 to Waller, 4,691,300 to Pelley, III et al. and 4,737,935 to Wawersig et al. In each of the above patents the concept is taught of a memory device that, upon detecting an address to a defective cell redirects such address to a redundant cell.

Accordingly, it is an object of this invention to provide a DRAM that exhibits decreased power requirements and increased intervals between refresh cycles.

It is another object of this invention to provide a DRAM which is particularly suited to perform the function of a direct access storage device.

It is still a further object of this invention to provide a low power DRAM with redundant storage cells that enable the DRAM to exhibit, non-volatile storage capabilities.

SUMMARY OF THE INVENTION

A DRAM is described including a plurality of operable storage cells, each cell including a capacitance for storing a charge indicative of data. The charge tends to dissipate below an acceptable level after a predetermined time interval T1 for a majority of the operable cells and for a minority of the operable cells, it dissipates below the acceptable level after a shorter time interval T2. The time between DRAM refresh cycles is adjusted so as to be greater than time interval T2. The DRAM comprises: a plurality of redundant storage cells; a decoder for receiving the address of an operable memory cell and providing a first output if the address indicates one of the operable cells of the minority of cells and a second output if the address indicates one of the operable cells of the majority. A switching circuit is responsive to the first output to enable access of a redundant storage cell and to prevent access of the minority storage cell. In a preferred embodiment, the redundant storage cells are configured as static storage circuits.

DETAILED DESCRIPTION OF THE INVENTION

Figure 1:
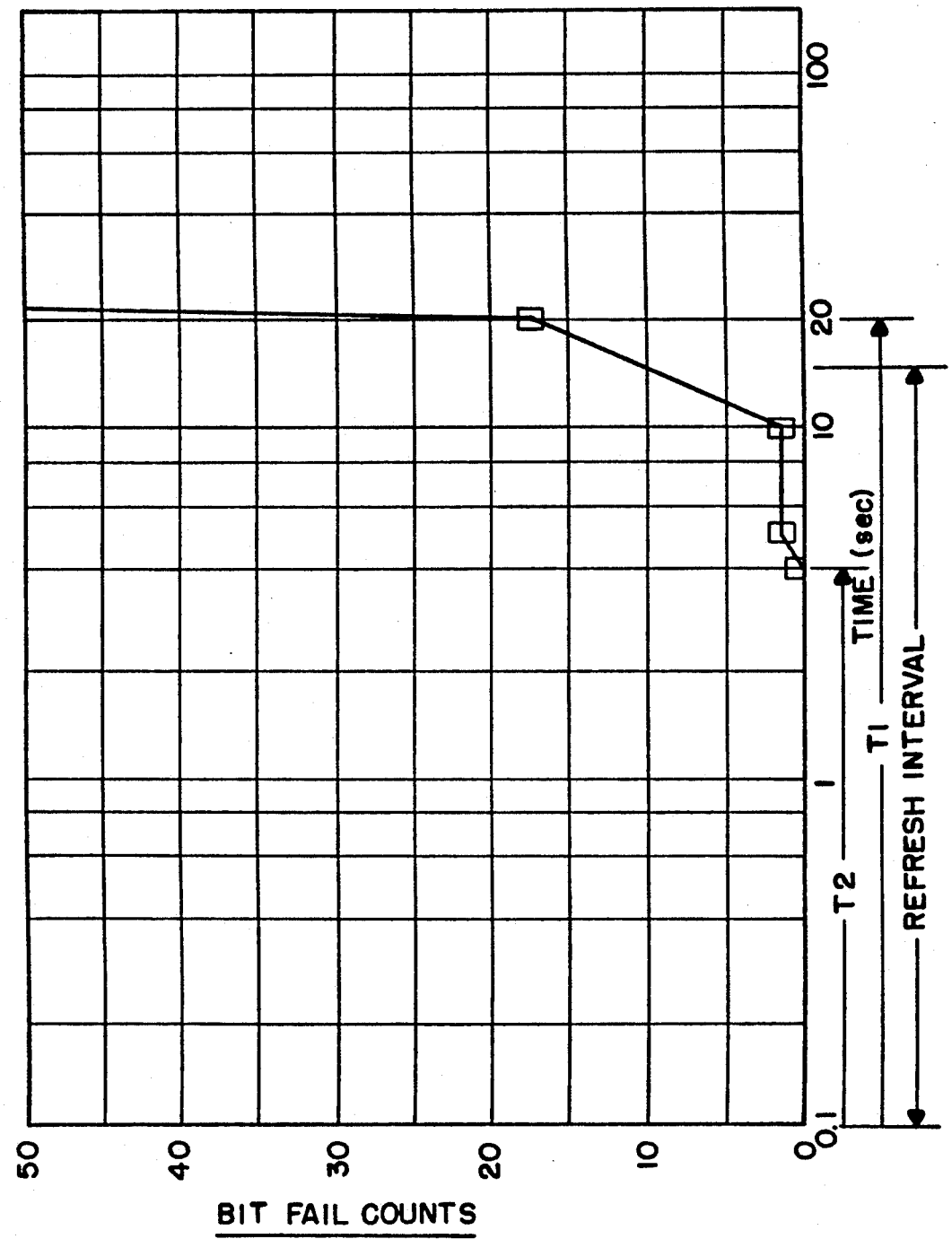
FIG. 1 is a plot of a count of "bit fails" versus time in a a one megabit DRAM.

Referring to FIG. 1 a plot is shown of time (plotted as a logarithmic scale) versus bit fail counts for a one Mb DRAM at room temperature. FIG. 1 was obtained by writing in known bit patterns into a 1 Mb DRAM on a repetitive basis and incrementing the time interval between refresh cycles An examination of the plot shows that while a few early bit fails occur before 10 seconds, the bulk of storage cell fails occur beyond 20 seconds. It can be seen from the plot that if the refresh period is extended to, say, eight seconds, a very small number of operable DRAM cells need to be replaced in order to have a fully operational memory, even with the extended interval between refreshes. This increase in interval between refresh cycles represents a factor of at least 10 improvement over the normal refresh cycle interval, (generally less than one second).

The interval between refresh cycles is thus increased so that refresh occurs between T1 and T2 (see FIG. 1), thereby reducing the refresh duty cycle in comparison to the prior art. The extension of the interval between refresh cycles reduces the power consumption of the chip; reduces its temperature; and enables backup batteries to operate for a longer period.

Figure 2:
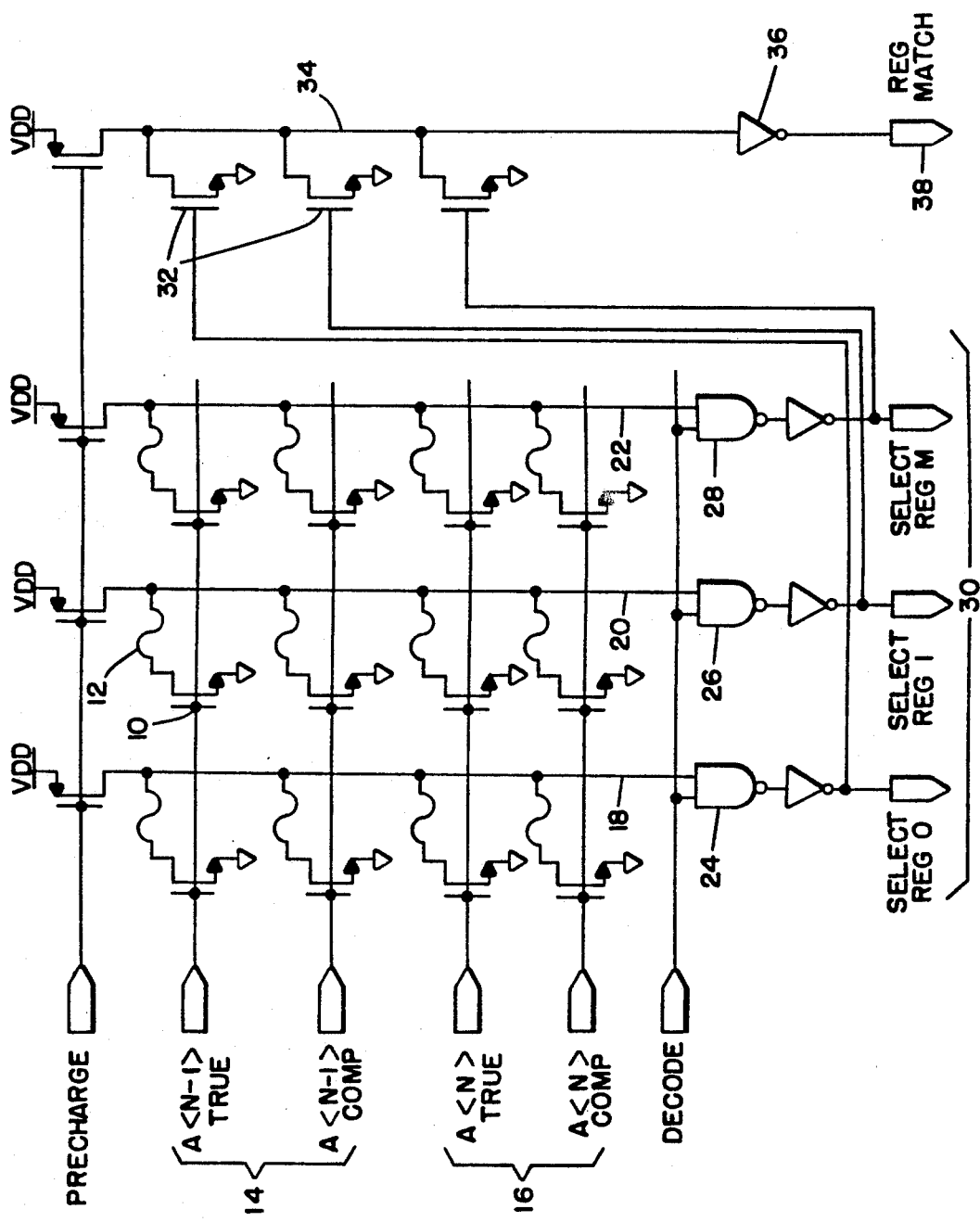
FIG. 2 is a circuit diagram of a representative ROM used for address matching.

To identify the early fail cells, a retention test is performed during wafer final test and a decoder ROM is programmed that contains the early fail cell addresses. Such a decoder ROM is shown in FIG. 2 and comprises a plurality of n channel FETs 10 which are connected in a decoder configuration. Each FET 10 has connected to its source, a fuse 12 which may be left intact or blown by using either an over-current procedure or selective laser burn. Each vertical group of transistors is thus programmed by selectively opening fuses 12, to enable the vertically connected transistor to all become non-conductive upon receiving a matching address.

The circuit configuration shown in FIG. 2 is conventional. Its operation is as follows. When an address is received on input terminals 14 and 16 that indicates an early fail cell, all of transistors 10 that remain connected to a column conductor 18, 20, or 22 are rendered non-conductive thereby causing a high output to be applied to one of NAND circuits 24, 26 or 28. A decode signal is also applied and, as a result, the one NAND circuit whose connected column line input has traversed to the high state, causes its output to fall, which output is inverted and applied to one of a plurality of output terminals 30.

Figure 3:
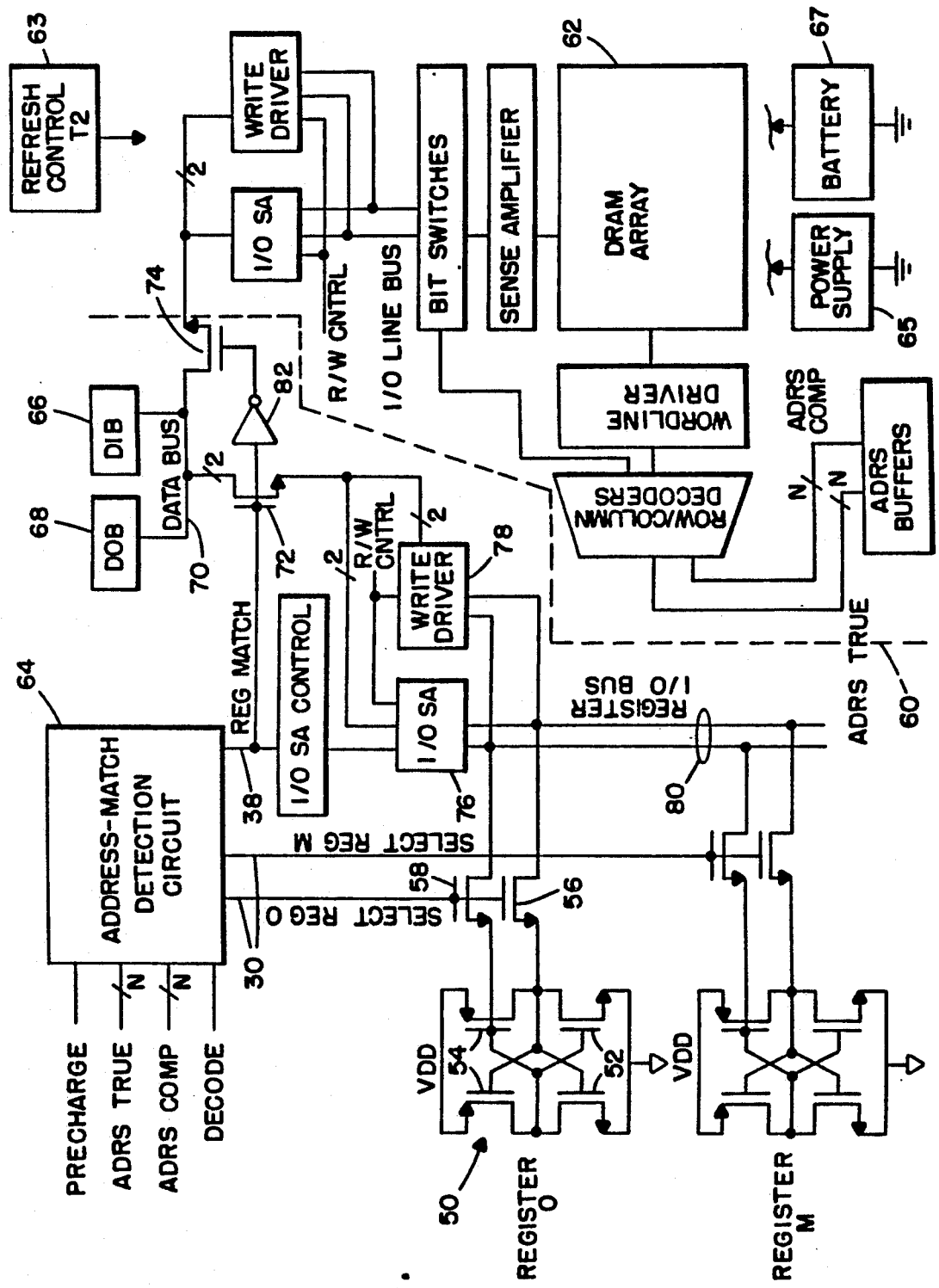
FIG. 3 is a block/circuit diagram of a DRAM incorporating the invention hereof.

A high output on any one of terminals 30 causes a connected bistable register cell 50 (i.e., a static memory cell) to be selected (See FIG. 3). In addition, when any terminal 30 traverses to the high state, one of a plurality of "register match" N-channel FETs 32 is rendered conductive, causing a connected conductor 34 to traverse to the low state. The level on conductor 34 is inverted by inverter 36 and is applied to output terminal 38. The resulting high state indicates that a register match has been found and that a static register cell is to be addressed, rather than a dynamic cell in the connected DRAM.

The size of the ROM in FIG. 2 is $2N \times M$ bits, where N is the total number of row and column address bits, and M is the number of replaceable cells or registers, respectively. For example, a low power, one Mbit DRAM with 10 row and 10 column addresses will need a 40 by 20 (800) bit ROM, where 20 is the number of replaceable cells or registers.

FIG. 3 shows an overall block diagram of a DRAM which implements the invention. A static register stage 50 acts as a "redundant storage cell" and comprises two cross coupled N and P transistor pairs 52 and 54, respectively, and a bit switch pair 56 and 58. Static register stage 50 consumes little continuous power, except for leakage current, and requires no refresh action. The circuit to the right of dotted line 60 indicates the block diagram for a conventional DRAM and includes a DRAM array 62, refresh control circuit 63, power supply 65 and back-up battery 67. Refresh control circuit 63 operates in the known manner to refresh the cells in DRAM array 62 at intervals between T1 and T2. The operation of the remainder of the circuits to the right of dotted line 6 is as in the prior art.

To the left of dotted line 60 is a switching circuit which enables addressed data, either from or to an "early fail" cell, to be diverted from DRAM array 62 to one of registers 50. Address match detection circuit 64 is identical to the circuit shown in FIG. 2. Data-in buffer 66 and data-out buffer 68 are connected to a data bus 70 whose operation is in turn controlled by a pair of N channel transistors 72 and 74.

A bit switch pair 56, 58 is controlled by a select reg. level appearing on one of select lines 30 from address-match detection circuit 64. As aforestated, there are M register stages so there will be 0 to M − 1 select reg lines 30 emanating from address-match detection circuit 64. Registers 50, input/output sense amplifier 76, and write driver circuit 78 are all connected to a common register I/O bus 80. I/O sense amplifier 76 and write driver circuit 78 are also connected to data bus 70 through N channel transistor 72. Transistors 72 and 74 are controlled by the level on reg. match output terminal 38 from circuit 64.

Consequently, it can be seen that as an incoming address to address-match detection circuit 64 matches one of the early fail cell addresses, a high level is applied to the matching select register output line 30. This enables selection of one of registers 50 for further read or write operations. In addition, a high output is manifested on reg. match terminal 38 causing N channel transistor 72 to become conductive and to connect data bus 70 to input/output sense amplifier circuit 76 and write driver circuit 78. Subsequent read/write control signals enable data to be either read from or written into one of static register cells 50. At the same time, the high level on terminal 38 is inverted by inverter 82 and causes transistor 74 to disconnect data bus 70 from DRAM array 62, thus preventing access to the addressed early fail cell.

The above noted cell-substitution invention for early fail cells offers a significant advantage in terms of the amount of silicon needed, compared to error correction using more conventional techniques. In order to do error correction in the general case on a one Mb card containing 9 one Mb chips, for example, an additional tenth chip would be required for the necessary two parity bits for single bit error correction, and two bit error detection. This would represent a substantial increase in the amount of silicon (one extra chip for every nine) needed to do the same function as the cell substitution technique described above. The ROM-based technique both provides for substantially increased refresh intervals; and also is internal to the chip and is therefore transparent to user.

Let it be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. A DRAM including a plurality of operable storage cells, each said cell including a capacitance for storing a charge indicative of data, said charge tending to dissipate below an acceptable level after a time T1 for a majority of said operable cells, and for a minority of said operable cells, to dissipate below said acceptable level after a shorter time T2, said DRAM having a refresh cycle wherein an interval between refresh cycles is greater than time T2, said DRAM comprising:

a plurality of redundant storage cells;

decoder means for receiving an address of an operable memory cell and providing a first output if said address indicates one of said operable cells of said minority, and a second output if said address indicates one of said operable cells of said majority; and switching means responsive to a said first output for enabling the access of a redundant storage cell and preventing access of said minority storage cell.

2. The DRAM as recited in claim 1 wherein each said redundant storage cell comprises:

a static memory cell.

3. The DRAM as recited in claim 2, wherein each said static memory cell is an MOS flip flop circuit for storing both the true and complement levels of a data signal.

4. The DRAM as recited in claim 3, wherein each said MOS flip flop circuit comprises two parts of bistably cross coupled N and P channel MOS transistors.

5. The DRAM as recited in claim 1 wherein said interval between refresh cycles is adjusted to be between times T1 and T2.

6. The DRAM as recited in claim 5 further comprising:

power supply means for said DRAM; and a battery for providing power to said DRAM in the event said power supply means ceases operation.

7. The DRAM as recited in claim 5 wherein said decoder means is a programmable ROM and stores an address for each one of said minority of operable cells, said addresses entered in said ROM at the time said DRAM is manufactured.

* * * * *